(12) United States Patent
Kim

(10) Patent No.: US 11,727,880 B2
(45) Date of Patent: Aug. 15, 2023

(54) PIXEL AND DISPLAY DEVICE INCLUDING THE SAME

(71) Applicant: Samsung Display Co., LTD., Yongin-si (KR)

(72) Inventor: Keun Woo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/971,445

(22) Filed: Oct. 21, 2022

(65) Prior Publication Data

US 2023/0186851 A1 Jun. 15, 2023

(30) Foreign Application Priority Data

Dec. 13, 2021 (KR) .................. 10-2021-0178132

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *H10K 59/1213* (2023.02); *H10K 59/1216* (2023.02); *H10K 59/131* (2023.02); *G09G 2300/0426* (2013.01); *G09G 2300/0819* (2013.01); *G09G 2300/0852* (2013.01); *G09G 2310/08* (2013.01); *G09G 2320/0247* (2013.01); *G09G 2330/021* (2013.01);
(Continued)

(58) Field of Classification Search
CPC ............... G09G 3/3225; G09G 3/3233; H10K 59/1213; H10K 59/131
See application file for complete search history.

(56) References Cited

U.S. PATENT DOCUMENTS 10,482,817 B2 11/2019 Kim et al.
2017/0365214 A1* 12/2017 Tsai ................... G09G 3/3266
(Continued)

FOREIGN PATENT DOCUMENTS

KR 1020180064619 6/2018
KR 1020210000350 1/2021
KR 1020220081435 6/2022

OTHER PUBLICATIONS

Keunwoo Kim, et al., "Double-Gate CMOS: Symmetrical-Versus Asymmetrical-Gate Devices", IEEE Transactions on Electron Devices, (Feb. 2001), vol. 48, No. 2, pp. 294-299.

*Primary Examiner* — Kevin M Nguyen
(74) *Attorney, Agent, or Firm* — Cantor Colburn LLP

(57) ABSTRACT

A pixel may include a light-emitting element, a first transistor including first and second gate electrodes, a second transistor which is connected between a data line and the second gate electrode, and turned on in response to a third scan signal, a third transistor which is connected between first and second nodes, and turned on in response to a second scan signal, a fourth transistor which is connected between the first node and a third power line, and turned on in response to a first scan signal, a fifth transistor which is connected between the first power line and the first transistor, and turned off in response to a first emission control signal, a sixth transistor which is turned off in response to a second emission control signal, and a first capacitor connected between the first power line and the first node.

20 Claims, 11 Drawing Sheets

(51) Int. Cl.
*H10K 59/131* (2023.01)
*H10K 59/121* (2023.01)
*H01L 27/12* (2006.01)
*H01L 29/786* (2006.01)

(52) U.S. Cl.
CPC ........ *H01L 27/124* (2013.01); *H01L 27/1225* (2013.01); *H01L 27/1251* (2013.01); *H01L 27/1255* (2013.01); *H01L 29/7869* (2013.01); *H01L 29/78675* (2013.01)

(56) References Cited

U.S. PATENT DOCUMENTS

| | | | |
|---|---|---|---|
| 2018/0211600 A1* | 7/2018 | Nie | G09G 3/3233 |
| 2020/0111855 A1 | 4/2020 | Bae et al. | |
| 2020/0219446 A1 | 7/2020 | Yoshida | |
| 2020/0402466 A1 | 12/2020 | Park et al. | |
| 2021/0125557 A1 | 4/2021 | Na | |
| 2021/0158755 A1 | 5/2021 | Li et al. | |
| 2021/0295784 A1 | 9/2021 | Kim et al. | |
| 2022/0181420 A1 | 6/2022 | Kim et al. | |
| 2022/0320227 A1* | 10/2022 | Gao | H01L 27/12 |
| 2022/0352287 A1* | 11/2022 | Liao | H10K 59/131 |

* cited by examiner

PIXEL AND DISPLAY DEVICE INCLUDING THE SAME

The application claims priority to Korean patent application number 10-2021-0178132, filed on Dec. 13, 2021, and all the benefits accruing therefrom under 35 U.S.C. § 119, the content of which in its entirety is herein incorporated by reference.

BACKGROUND

1. Field

Various embodiments of the invention relate to a display device, and more particularly, to a pixel and a display device including the pixel.

2. Description of Related Art

A display device may include a plurality of pixels. Each of the pixels may include a plurality of transistors, a light-emitting element electrically connected to the transistors, and a capacitor. The transistors may generate a driving current based on signals provided through signal lines. The light-emitting element may emit light based on the driving current.

To enhance the driving efficiency of the display device depending on driving conditions, there is a desire to reduce the power consumption of the display device. The power consumption of the display device may be reduced by reducing a frame frequency (or a driving frequency) when a static image is displayed, for example. Furthermore, the display device may display an image at a high frame frequency of 120 hertz (Hz) or more so as to implement a high resolution image, a stereoscopic image, or etc.

As such, to display images under various conditions, the display device may display images at various frame frequencies (or various driving frequencies).

SUMMARY

Various embodiments of the invention are directed to a pixel which performs a high speed driving operation by supplying a data signal to at least one of a first gate electrode and a second gate electrode of a first transistor having a double gate structure.

Various embodiments of the invention are directed to a display device including the pixel.

However, features of the invention are not limited to the above-described objects, and various modifications are possible without departing from the spirit and scope of the invention.

A pixel in an embodiment of the invention includes a light-emitting element, a first transistor which generates a driving current that flows from a first power line which provides a first power voltage to a second power line which provides a second power voltage through the light-emitting element, the first transistor including a first gate electrode and a second gate electrode, a second transistor which is connected between a data line and the second gate electrode of the first transistor, and turned on in response to a third scan signal supplied to a third scan line, a third transistor which is connected between a first node connected to the first gate electrode of the first transistor and a second node, and turned on in response to a second scan signal supplied to a second scan line, a fourth transistor which is connected between the first node and a third power line for providing a third power voltage, and turned on in response to a first scan signal supplied to a first scan line, a fifth transistor which is connected between the first power line and the first transistor, and turned off in response to a first emission control signal supplied to a first emission control line, a sixth transistor which is connected between a third node connected to an electrode of the light-emitting element and the second node, and turned off in response to a second emission control signal supplied to a second emission control line, and a first capacitor connected between the first power line and the first node.

In an embodiment, the pixel may further include a second capacitor connected between the second gate electrode of the first transistor and the second transistor.

In an embodiment, the pixel may further include a connection line which connects the first gate electrode and the second gate electrode.

In an embodiment, the third transistor and the fourth transistor each may include an n-type oxide semiconductor transistor. The first transistor, the second transistor, the fifth transistor, and the sixth transistor each may include a p-type poly-silicon semiconductor transistor.

In an embodiment, the sixth transistor may be in a turned off state during a non-emission period. The sixth transistor may be in a turned on state during an emission period. The non-emission period may include a first period during which the fifth transistor is in a turned on state, and a second period during which the fifth transistor is in a turned off state.

In an embodiment, the third transistor and the fourth transistor may be respectively turned on at time points different from each other in the first period. The second transistor may be turned on in the second period.

In an embodiment, the pixel may further include a seventh transistor which is connected between the third node and a fourth power line for providing a fourth power voltage, and turned on in response to a fourth scan signal supplied to a fourth scan line.

In an embodiment, in the second period, the fourth transistor may be turned on after the second transistor is turned off.

In an embodiment, the first gate electrode and the second gate electrode may be electrically insulated from each other.

In an embodiment, the first transistor may further include a lower metal layer disposed on the substrate, and including the second gate electrode, and a first semiconductor pattern disposed on a buffer layer that covers the lower metal layer, and including a first active area, and the first gate electrode may be disposed on the first gate insulating layer that covers the first semiconductor pattern, and overlap the first active area.

In an embodiment, a thickness of the buffer layer may be greater than a thickness of the first gate insulating layer.

In an embodiment, the second transistor may include a second semiconductor pattern disposed on a buffer layer, and including a second active area, and a gate electrode disposed on the first gate insulating layer, and overlapping the second active area.

In an embodiment, the second capacitor may include a first conductive pattern connected to the second gate electrode through a first contact hole, and disposed on the first gate insulating layer, and a second conductive pattern connected to the second semiconductor pattern through a second contact hole, and disposed on a second gate insulating layer that covers the first gate electrode, the second conductive pattern overlapping the first conductive pattern.

In an embodiment, the first capacitor may include a lower electrode corresponding to the first gate electrode, and an upper electrode disposed on the second gate insulating layer, and overlapping the lower electrode. The third transistor may include a third semiconductor pattern disposed on an inter-insulating layer that covers the upper electrode, and including a third active area, and a gate electrode overlapping the third active area.

A display device in an embodiment of the invention may include a pixel connected to first to third scan lines, first and second emission control lines, and a data line, a scan driver which supplies first to third scan signals to the first to the third scan lines, respectively, an emission driver which supplies first and second emission control signals to the first and second emission control lines, respectively, and a data driver which supplies a data signal to the data line. The pixel may include a light-emitting element, a first transistor which generates a driving current that flows from a first power line which provides a first power voltage to a second power line which provides a second power voltage through the light-emitting element, the first transistor including a first gate electrode and a second gate electrode, a second transistor which is connected between the data line and the second gate electrode of the first transistor, and turned on in response to the third scan signal supplied to the third scan line, a third transistor which is connected between a first node connected to the first gate electrode of the first transistor and a second node, and turned on in response to the second scan signal supplied to the second scan line, a fourth transistor which is connected between the first node and a third power line for providing a third power voltage, and turned on in response to the first scan signal supplied to the first scan line, a fifth transistor which is connected between the first power line and the first transistor, and turned off in response to the first emission control signal supplied to the first emission control line, and a sixth transistor which is connected between a third node connected to an electrode of the light-emitting element and the second node, and turned off in response to the second emission control signal supplied to the second emission control line.

In an embodiment, the pixel may include a capacitor connected between the second gate electrode of the first transistor and the second transistor, and a connection line which connects the first gate electrode and the second gate electrode.

In an embodiment, the third transistor and the fourth transistor each may include an n-type oxide semiconductor transistor. The first transistor, the second transistor, the fifth transistor, and the sixth transistor each may include a p-type poly-silicon semiconductor transistor.

In an embodiment, the emission driver may supply the second emission control signal during a non-emission period. The non-emission period may include a first period in which the first emission control signal is not supplied, and a second period in which the first emission control signal is supplied.

In an embodiment, the scan driver may alternately supply the first scan signal and the second scan signal in the first period. The scan driver may supply the third scan signal in the second period.

In an embodiment, the pixel may further include a seventh transistor which is connected between the third node and a fourth power line for providing a fourth power voltage, and turned on in response to the fourth scan signal supplied to the fourth scan line. The scan driver, in the second period, may supply the third scan signal and thereafter supply the fourth scan signal.

In embodiments of the invention, a pixel may include an oxide semiconductor transistor and a poly-silicon semiconductor transistor and a display device including the pixel may include a first transistor including a first gate electrode (a top gate) and a second gate electrode (a bottom gate), and have an improved pixel circuit structure in which a data signal is provided to at least one of the first and second gate electrodes. Furthermore, a threshold voltage compensation period and a data write (programming) period may be separately driven. Therefore, not only images of normal driving frequencies but also images capable of appropriately corresponding both to driving at low frequency of about 10 hertz (Hz) or less and to driving at high frequency of about 120 Hz or more may be displayed. Furthermore, a driving current may be rapidly and precisely controlled in response to frequent variation in driving frequency and a data signal change. Thus, image quality may be improved.

However, effects of the invention are not limited to the above-described effects, and various modifications are possible without departing from the spirit and scope of the invention.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
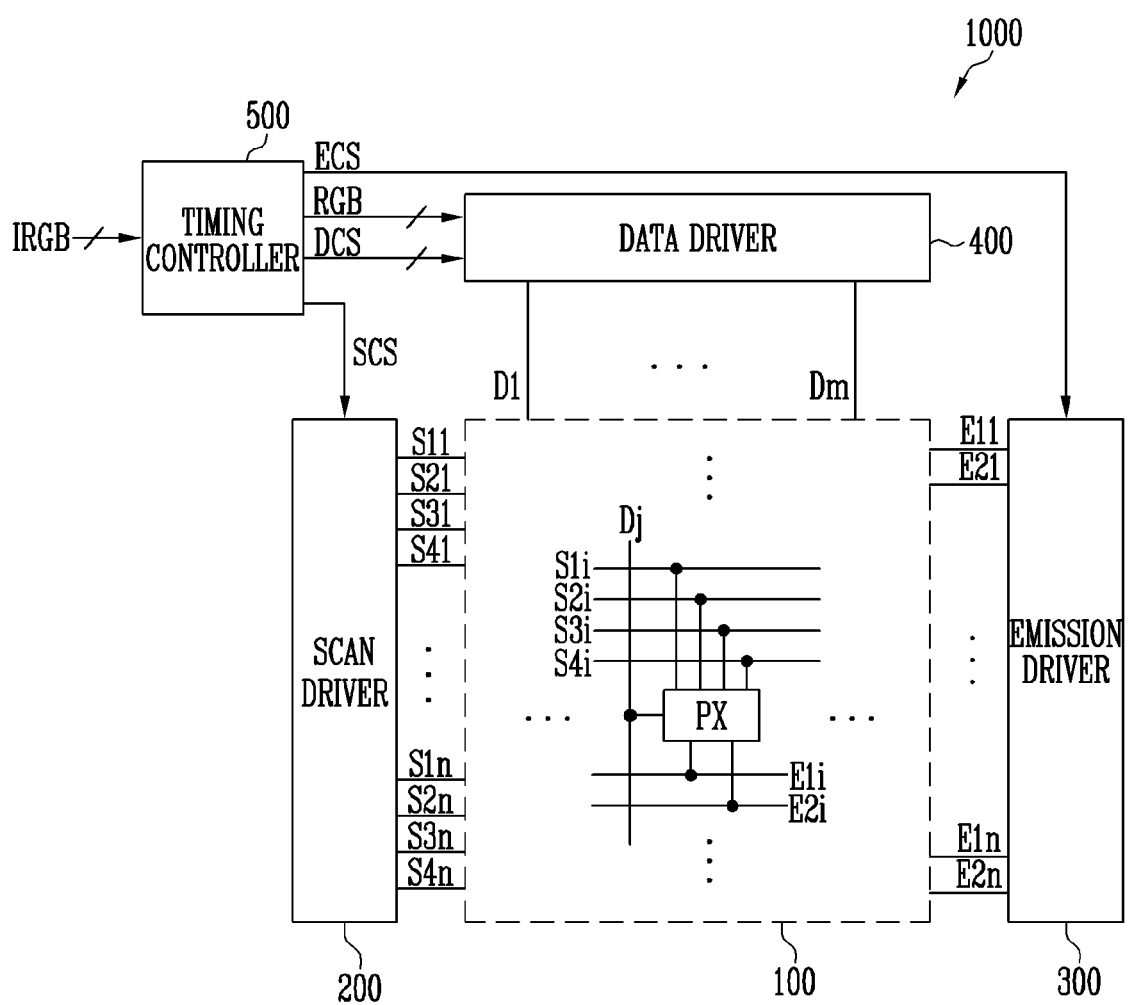
FIG. 1 is a block diagram illustrating a display device in accordance with the invention.

Various embodiments of the invention will hereinafter be described in detail with reference to the accompanying drawings. The same reference numerals are used throughout the different drawings to designate the same components, and repetitive description of the same components will be omitted.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a block diagram illustrating a display device 1000 in accordance with the invention.

Referring to FIG. 1, the display device 1000 may include a pixel area 100, a scan driver 200, an emission driver 300, a data driver 400, and a timing controller 500.

The display device 1000 may display images at various frame frequencies (refresh rates, or driving frequencies) depending on driving conditions. A frame frequency may be a frequency at which data voltages are substantially applied to a driving transistor of the pixel PX per second. In an embodiment, the frame frequency may also be also referred to as "scan rate" or "refresh frequency" and indicate the number of images displayed per second, for example.

In an embodiment, an output frequency of a fourth scan signal to be supplied to a third scan line S3$i$ (i is a natural number) for supplying a data signal from the data driver 400 may be changed in response to the frame frequency. In an embodiment, the frame frequency for driving a video may be a frequency of approximately 60 hertz (Hz) or more (e.g., about 60 Hz, about 120 Hz, about 240 Hz, about 360 Hz, or about 480 Hz), for example. In a case that the frame frequency is about 60 Hz, a third scan signal may be supplied to each horizontal line (each pixel row) sixty times per second.

In an embodiment, the display device 1000 may adjust, depending on driving conditions, the output frequencies of the scan driver 200 and the emission driver 300 and an output frequency of the data driver 400 corresponding thereto. In an embodiment, the display device 1000 may display images in response to various frame frequencies ranging from about 1 Hz to 240 Hz, for example. However, this is only for illustrative purposes. In an embodiment, the display device 1000 may display images at a frame frequency (e.g., about 300 Hz or about 480 Hz) greater than about 240 Hz, for example.

The pixel area 100 may include scan lines S1$1$ to S1$n$ (n is a natural number greater than 1), S2$1$ to S2$n$, S3$1$ to S3$n$, and S4$1$ to S4$n$, emission control lines E1$1$ to E1$n$ and E2$1$ to E2$n$, and data lines D1 to Dm (m is a natural number greater than 1), and may include pixels PX connected to the scan lines S1$1$ to S1$n$, S2$1$ to S2$n$, S3$1$ to S3$n$, and S4$1$ to S4$n$, the emission control lines E1$1$ to E1$n$ and E2$1$ to E2$n$, and the data lines D1 to Dm. Here, i may be equal to less than n. Each of the pixels PX may include a driving transistor and a plurality of switching transistors.

The timing controller 500 may be supplied with input image data IRGB and control signals from a host system such as an application processor ("AP") through an interface. The timing controller 500 may control driving timings of the scan driver 200, the emission driver 300, and the data driver 400.

The timing controller 500 may generate a first control signal SCS, a second control signal ECS, and a third control signal DCS based on input image data IRGB, control signals, and clock signals. The first control signal SCS may be supplied to the scan driver 200. The second control signal ECS may be supplied to the emission driver 300. The third control signal DCS may be supplied to the data driver 400. The timing controller 500 may rearrange the input image data IRGB and supply the rearranged input image data IRGB to the data driver 400.

The scan driver 200 may receive the first control signal SCS from the timing controller 500, and supply a first scan signal, a second scan signal, a third scan signal, and a fourth scan signal respectively to the first scan lines S1$1$ to S1$n$, the second scan lines S2$1$ to S2$n$, the third scan lines S3$1$ to S3$n$, and the fourth scan lines S4$1$ to S4$n$, based on the first control signal SCS.

The first to fourth scan signals may be set to gate-on levels corresponding to the types of transistors to which the corresponding scan signals are supplied. A transistor that receives a scan signal may be set to a turn-on state when a scan signal having the gate-on level is supplied thereto. In an embodiment, a gate-on level of a scan signal to be supplied to a P-channel metal oxide semiconductor ("PMOS") transistor may be a logic low level, and a gate-on level of a scan signal to be supplied to an N-channel metal oxide semiconductor ("NMOS") transistor may be a logic high level, for example. Hereinafter, the expression "scan signal is supplied" may be understood to mean that the scan signal is supplied at a logic level that enables a transistor controlled thereby to be turned on.

In an embodiment, the scan driver 200 may supply some of the first to fourth scan signals a plurality of times during a non-emission period. Consequently, a bias state of the driving transistor included in the pixel PX may be controlled.

The emission driver 300 may supply a first emission control signal and a second emission control signal, respectively, to the first emission control lines E11 to E1n and the second emission control liens E21 to E2n, based on the second control signal ECS.

The first and second emission control signals each may be set to a gate-off level (e.g., a high voltage level). A transistor that receives the first emission control signal or the second emission control signal may be turned off when the emission control signal having the gate-off level is supplied thereto, and may be turned on when the emission control signal having the gate-on level is supplied thereto. Hereinafter, the expression "emission control signal is supplied" may be understood to mean that the emission control signal is supplied at a logic level (e.g., a high level) that enables a transistor controlled thereby to be turned off.

Although for convenience of description FIG. 1 illustrates that the scan driver 200 and the emission driver 300 each is provided as a single component, the invention is not limited thereto. Depending on the design, the scan driver 200 may include a plurality of scan drivers each of which supplies at least one of the first to fourth scan signals. Furthermore, at least some of the scan driver 200 and the emission driver 300 may be integrated into a driving circuit, a module, or the like.

The data driver 400 may receive the third control signal DCS and image data RGB from the timing controller 500. The data driver 400 may convert digital image data RGB into an analog data signal (a data voltage). The data driver 400 may supply data signals to the data lines D1 to Dm in response to the third control signal DCS. Here, the data signals supplied to the data lines D1 to Dm may be supplied in synchronization with the third scan signal supplied to the third scan lines S31 to S3n.

In an embodiment, the display device 1000 may further include a power supply. The power supply may supply power voltages for driving the pixel PX to the pixel area 100.

The display device 1000 may be operated at various frame frequencies. In the case of low-frequency driving, an image defect such as flicker attributable to current leakage in the pixel may be visible. Furthermore, an afterimage such as motion blur may be visible due to a change in response speed caused by a threshold voltage shift or the like resulting from a change in bias state or hysteresis characteristics of the driving transistor by driving at various frame frequencies.

To improve image quality, each frame period of the pixel PX may include a plurality of non-emission periods and a plurality of emission periods, depending on a frame frequency. In an embodiment, an initial non-emission period and an emission period of a frame may be defined as a first driving period, and a subsequent non-emission period and a subsequent emission period may be defined as a second driving period, for example.

In an embodiment, a data signal for substantially displaying an image may be supplied to the pixel PX during the first driving period, and a set voltage (an initialization voltage) may be periodically supplied to an anode electrode of a light-emitting element of the pixel PX, for example.

In the case of high-speed driving of about 120 Hz or more, a sufficient amount of threshold voltage compensation time of the driving transistor is desired to be secured so as to embody at least standard image quality. The pixel PX and the display device 1000 in embodiments of the invention may ensure a sufficient amount of threshold voltage compensation time and display high quality images at various frame frequencies.

Furthermore, in response to rapid changes of images in the high speed driving, the driving current of the pixel PX is also desired to rapidly vary. The pixel PX and the display device 1000 in embodiments of the invention may display high quality images thanks to rapid variation in the driving current in response to high speed driving.

Figure 2:
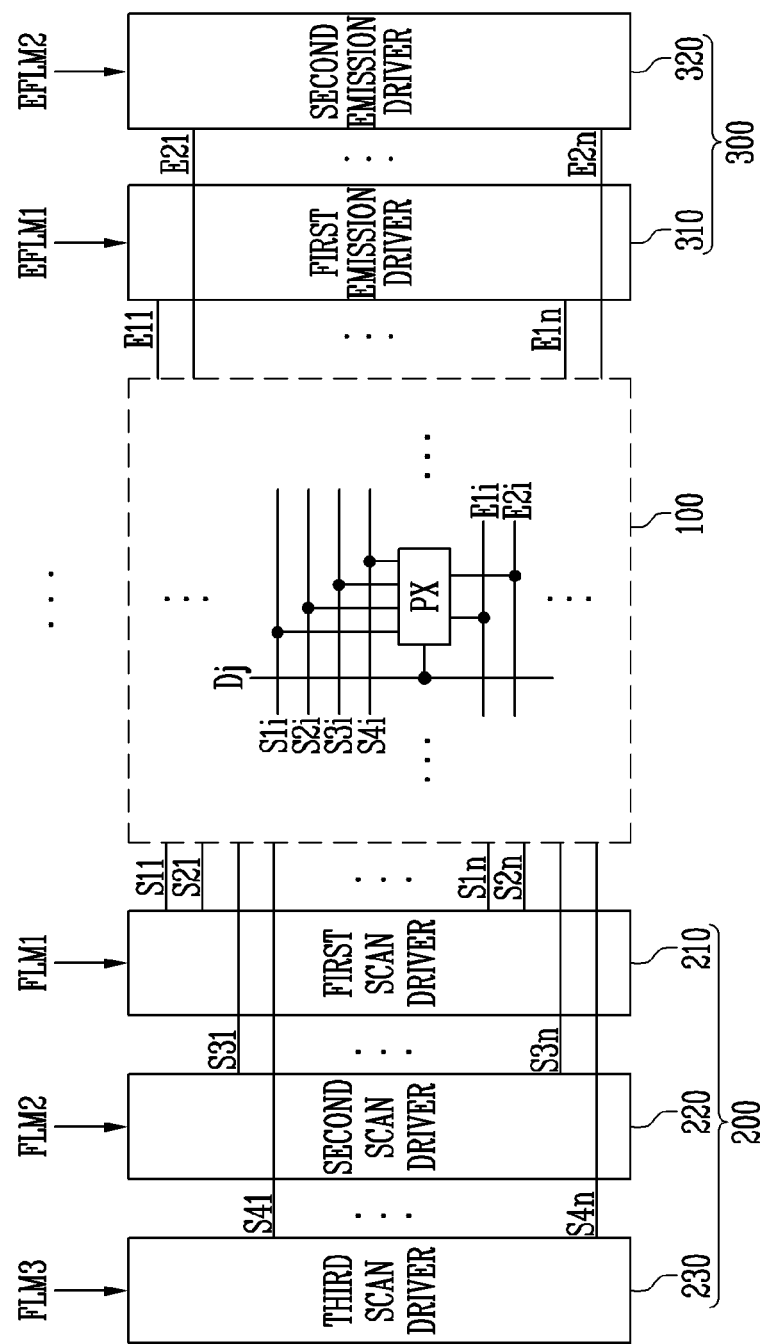
FIG. 2 is a diagram illustrating embodiments of a scan driver and an emission driver that are included in the display device of FIG. 1.

FIG. 2 is a diagram illustrating embodiments of the scan driver 200 and the emission driver 300 that are included in the display device 1000 of FIG. 1.

Referring to FIGS. 1 and 2, the scan driver 200 may include a first scan driver 210, a second scan driver 220, and a third scan driver 230.

In an embodiment, the first, second, and third scan drivers 210, 220, and 230 may respectively include stage circuits that are separately dependently connected thereto.

The first control signal SCS may include first, second, and third scan start signals FLM1, FLM2, and FLM3. The first, second, and third scan start signals FLM1, FLM2, and FLM3 may be respectively supplied to the first, second, and third scan drivers 210, 220, and 230.

Pulse widths, supply timings, or the like of the first, second, and third scan start signals FLM1, FLM2, and FLM3 may be determined depending on driving conditions and frame frequencies.

The first, second, and third scan signals may be respectively outputted based on the first, second, and third scan start signals FLM1, FLM2, and FLM3. In an embodiment, the pulse width of at least one of the first, second, and third scan signals may differ from that of the other signals, for example. Furthermore, at least one of the first, second, and third scan signals may be outputted a plurality of times during the non-emission period.

In addition, the gate-on levels of the first, second, and third scan signals each may be determined depending on the type of transistor corresponding thereto.

The first scan driver 210 may supply the first scan signal to the first scan lines S11 to S1n in response to the first scan start signal FLM1. Furthermore, the first scan driver 210 may supply the second scan signal to the second scan lines S21 to S2n in response to the first scan start signal FLM1. A pulse width of the second scan signal may be the same as that of the first scan signal. In an embodiment, the second scan signal to be supplied to the same pixel may be a signal obtained by shifting the first scan signal, for example. In an embodiment, a second scan line (e.g., S2i) connected to an i-th pixel row (where i is a natural number) may be connected to a first scan line (e.g., S1i+k) connected to an i+k-th pixel row (where k is a natural number), for example.

The second scan driver 220 may supply the third scan signal to the third scan lines S31 to S3n in response to the second scan start signal FLM2.

The third scan driver 230 may supply the fourth scan signal to the fourth scan lines S41 to S4n in response to the third scan start signal FLM3.

In an embodiment, the emission driver 300 may include a first emission driver 310 and a second emission driver 320.

The second control signal ECS may include first and second emission control start signals EFLM1 and EFLM2. The first and second emission control start signals EFLM1 and EFLM2 may be respectively supplied to the first and second emission drivers 310 and 320.

In an embodiment, the first and second emission drivers 310 and 320 may respectively include stage circuits that are separately dependently connected thereto. Furthermore, a pulse width, a supply timing, or the like of the first emission control signal may differ from those of the second emission control signal.

The first emission driver 310 may supply the first emission control signal to the first emission control lines E11 to E1n in response to the first emission control start signal EFLM1. The second emission driver 320 may supply the second emission control signal to the second emission control lines E21 to E2n in response to the second emission control start signal EFLM2.

Figure 3:
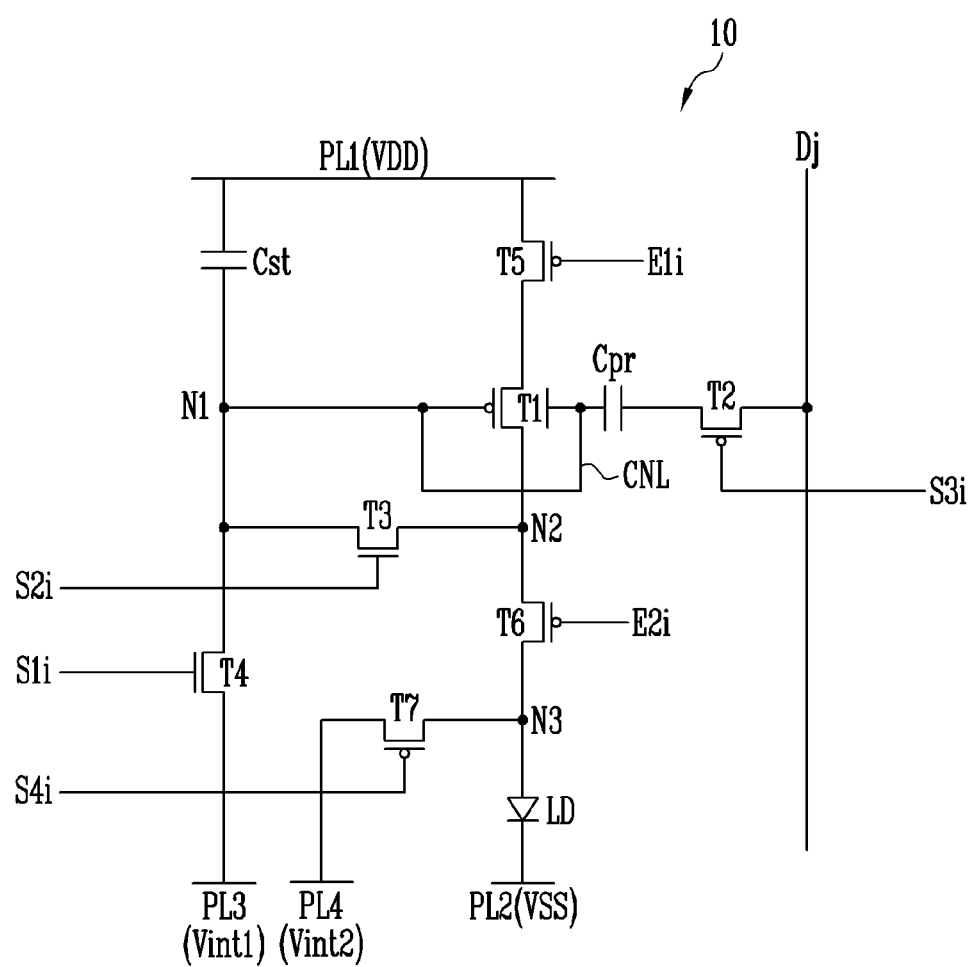
FIG. 3 is a circuit diagram illustrating a pixel in accordance with the invention.

FIG. 3 is a circuit diagram illustrating a pixel in accordance with the invention.

For convenience of description, FIG. 3 illustrates a pixel 10 disposed on an i-th horizontal line (or an i-th pixel row) and connected to a j-th data line Dj (where each of i and j is a natural number).

Referring to FIGS. 1 and 3, the pixel 10 may include a light-emitting element LD, first to seventh transistors T1 to T7, a first capacitor Cst (also referred to as "storage capacitor"), and a second capacitor Cpr (also referred to as "programmable capacitor).

The light-emitting element LD may include a first electrode (e.g., an anode electrode) connected to a third node N3, and a second electrode (e.g., a cathode electrode) connected to a second power line PL2 which transmits a second power voltage VSS to the light-emitting element LD. The light-emitting element LD may generate light having a luminance corresponding to the amount of current supplied from the first transistor T1.

The second power line PL2 may have a line type, but the invention is not limited thereto. In an embodiment, the second power line PL2 may be a conductive plate type conductive layer, for example.

In an embodiment, the light-emitting element LD may be an organic light-emitting diode including an organic light-emitting layer. In an alternative embodiment, the light-emitting element LD may be an inorganic light-emitting element including inorganic material. As a further alternative, the light-emitting element LD may include a combination of inorganic material and organic material. The light-emitting element LD may have a shape in which a plurality of inorganic light-emitting elements are connected in parallel and/or series between the second power line PL2 and the third node N3.

The first transistor T1 (or the driving transistor) may be connected between the fifth transistor T5 and a second node N2. The first transistor T1 may include a first gate electrode and a second gate electrode. In an embodiment, the first transistor T1 may have a double gate structure including a top gate electrode and a bottom gate electrode (also referred to as a front gate electrode and a back gate electrode), for example.

The first gate electrode of the first transistor T1 may be connected to a first node N1. The second gate electrode of the first transistor T1 may be electrically connected to the second transistor T2.

In an embodiment, the first gate electrode and the second gate electrode may be connected to each other by a connection line CNL. Therefore, a voltage supplied from the j-th data line Dj or the second capacitor Cpr may be provided in common to the first gate electrode and the second gate electrode.

The first transistor T1 may control, based on a voltage of the first node N1 (e.g., a voltage of the first gate electrode) and/or a voltage of the second gate electrode, the driving current that flows from a first power line PL1, which provides the first power voltage VDD, to the second power line PL2, which provides the second power voltage VSS, via the light-emitting element LD. In an embodiment, the first power voltage VDD may be set to a voltage having a level higher than that of the second power voltage VSS, for example.

The second transistor T2 may be connected between the j-th data line Dj (hereinafter, also referred to as "data line") and the second gate electrode of the first transistor T1. In an embodiment, the second transistor T2 may be connected between the data line Dj and one electrode of the second capacitor Cpr.

A gate electrode of the second transistor T2 may be connected to an i-th third scan line S3i (hereinafter, also referred to as a third scan line). When a third scan signal is supplied to the third scan line S3i, the second transistor T2 may be turned on to electrically connect the data line Dj with the second capacitor Cpr. When the second transistor T2 is turned on, the data signal may be provided to the second capacitor Cpr.

In an embodiment, the second capacitor Cpr may be connected between the second gate electrode of the first transistor T1 and the second transistor T2. Furthermore, the second capacitor Cpr may be connected in common to the second gate electrode of the first transistor T1 and one end of the connection line CNL. The second capacitor Cpr may write the data signal to the first transistor T1. The second capacitor Cpr may reliably transmit the data signal to the first gate electrode and the second gate electrode of the first transistor T1.

The third transistor T3 may be connected between the second electrode (i.e., the second node N2) of the first transistor T1 and the first node N1. A gate electrode of the third transistor T3 may be connected to an i-th second scan line S2i (hereinafter, also referred to as a second scan line).

When a second scan signal is supplied to the second scan line S2i, the third transistor T3 may be turned on so that the second electrode of the first transistor T1 may be electrically connected with the first node N1. In other words, the second scan signal may be used to control a timing at which the second electrode (e.g., the drain electrode) of the first transistor T1 and the first gate electrode (and the second gate electrode) of the first transistor T1 are connected to each other. When the third transistor T3 is turned on, the first transistor T1 may be connected in the form of a diode.

The fourth transistor T4 may be connected between the first node N1 and a third power line PL3 which provides a third power voltage Vint1 (e.g., a first initialization voltage).

A gate electrode of the fourth transistor T4 may be connected to an i-th first scan line S1i (hereinafter, also referred to as a first scan line).

When the first scan signal is supplied to the first scan line S1i, the fourth transistor T4 may be turned on so that the third power voltage Vint1 may be supplied to the first node N1. In an embodiment, the third power voltage Vint1 may be set to a voltage lower than a minimum level of the data signal to be supplied to the data line Dj, for example.

In an embodiment, the third transistor T3 and the fourth transistor T4 may include oxide semiconductor transistors. The third transistor T3 and the fourth transistor T4 each may include an oxide semiconductor layer as an active layer (a semiconductor layer). In an embodiment, the third transistor T3 and the fourth transistor T4 may include n-type oxide semiconductor transistors, for example.

An oxide semiconductor transistor may be produced through a low-temperature process, and have low charge mobility compared to that of the poly-silicon semiconductor transistor. In other words, the oxide semiconductor transistor may have excellent off-current characteristics. Therefore, when the third transistor T3 and the fourth transistor T4 include oxide semiconductor transistors, leakage current (and off current) generated through the third transistor T3 and the fourth transistor T4 according to low frequency driving and variable frequency driving may be minimized, so that the display quality may be enhanced.

The fifth transistor T5 may be connected between the first power line PL1 and the first electrode (e.g., the source electrode) of the first transistor T1. A gate electrode of the fifth transistor T5 may be connected to an i-th first emission control line E1i (hereinafter, also referred to as a first emission control line).

The fifth transistor T5 may be turned off when the first emission control signal having a gate-off level is supplied to the first emission control line E1i, and may be turned on when the first emission control signal having a gate-on level is supplied to the first emission control line E1i. When the fifth transistor T5 is turned on, the first electrode of the first transistor T1 may be electrically connected to the first power line PL1.

The sixth transistor T6 may be connected between the second node N2 and the third node N3. A gate electrode of the sixth transistor T6 may be connected to an i-th second emission control line E2i (hereinafter, also referred to as a second emission control line).

The sixth transistor T6 may be turned off when the second emission control signal having a gate-off level is supplied to the second emission control line E2i, and may be turned when the second emission control signal having a gate-on level is supplied to the second emission control line E2i. When the sixth transistor T6 is turned on, the second node N2 and the third node N3 may be electrically connected to each other.

The seventh transistor T7 may be connected between the third node N3 and a fourth power line PL4 which provides a fourth power voltage Vint2. A gate electrode of the seventh transistor T7 may be connected to an i-th fourth scan line S4i (hereinafter, also referred to as a fourth scan line).

When the fourth scan signal is supplied to the fourth scan line S4i, the seventh transistor T7 may be turned on so that the fourth power voltage Vint2 (e.g., a second initialization voltage) may be supplied to the third node N3.

When the fourth power voltage Vint2 is supplied to the first electrode of the light-emitting element LD, a parasitic capacitor of the light-emitting element LD may be discharged. As residual voltage charged into the parasitic capacitor is discharged (removed), undesired minute emission may be prevented. Therefore, the black expression performance of the pixel 10 may be enhanced. Particularly, low gray scale image quality in the low frequency driving may be further improved.

The third power voltage Vint1 and the fourth power voltage Vint2 may differ from each other. In other words, a voltage of initializing the first node N1 and a voltage of initializing the third node N3 may be set to different values.

In an embodiment, to minimize a flicker phenomenon in the low frequency driving, a level of the third power voltage Vint1 may be higher than a level of the second power voltage VSS. Furthermore, to prevent the parasitic capacitor of the light-emitting element LD from being charged, a level of the fourth power voltage Vint2 may be lower than a level of the second power voltage VSS. The foregoing is only an example, and the third power voltage Vint1 and the fourth power voltage Vint2 may be the same as each other.

The first capacitor Cst may be connected between the first power line PL1 and the first node N1. The first capacitor Cst may store a voltage corresponding to a difference in voltage between the first power line PL1 and the first node N1.

Some transistors of the pixel 10 may be poly-silicon semiconductor transistors. In an embodiment, the first, second, fifth, sixth, and seventh transistors T1, T2, T5, T6, and T7 may include, as an active layer (channel), a poly-silicon semiconductor layer formed or provided through a low temperature poly-silicon ("LTPS") process, for example. Since a poly-silicon semiconductor transistor has an advantage of a high response speed, the poly-silicon semiconductor transistor may be applied in a switching element in which a high-speed switching operation is desired.

However, the foregoing is only an example, and the types and kinds of transistors are not limited thereto.

Figure 4:
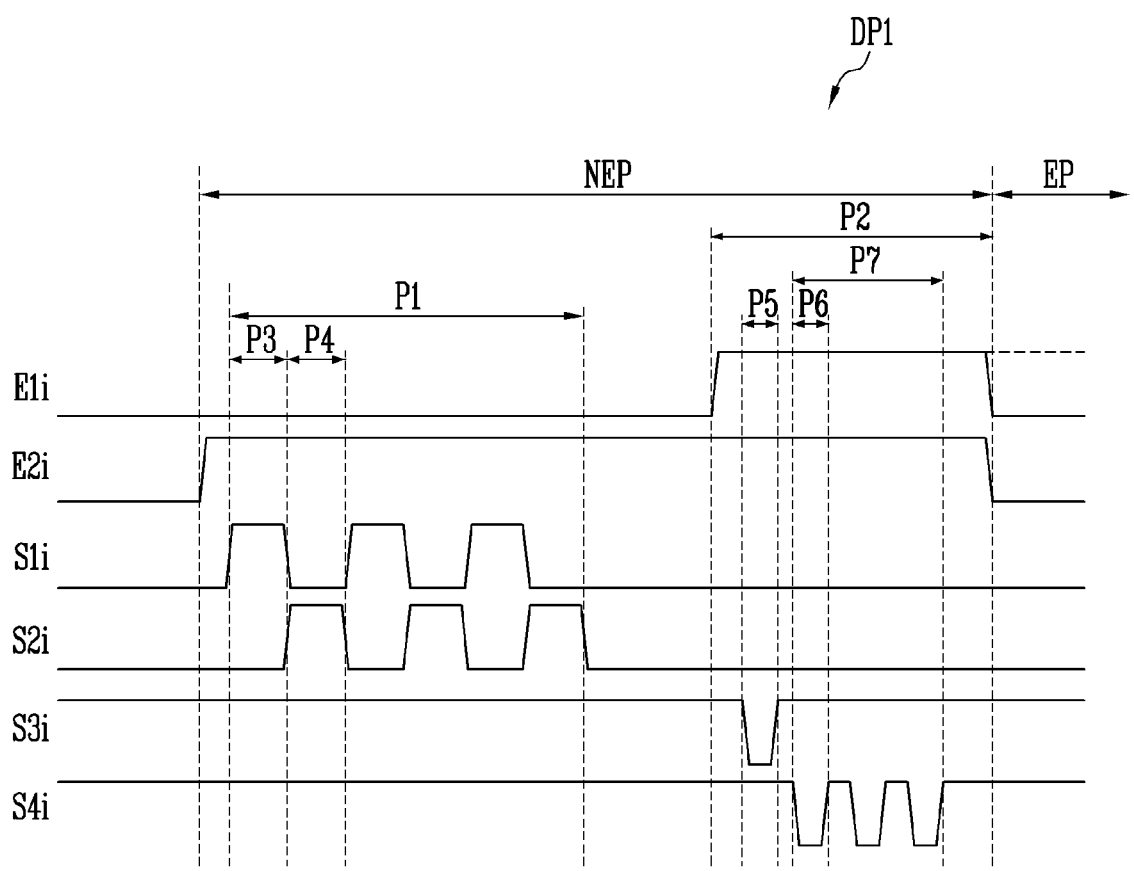
FIG. 4 is a timing diagram illustrating an embodiment of signals to be supplied to the pixel of FIG. 3 during a first driving period.

FIG. 4 is a timing diagram illustrating an embodiment of signals to be supplied to the pixel 10 of FIG. 3 during a first driving period.

Referring to FIGS. 3 and 4, the pixel 10 may be operated during a first driving period DP1.

In variable frequency driving for controlling a frame frequency, each frame period may include the first driving period DP1. Furthermore, a second driving period DP2 of FIG. 6 may be omitted or performed at least one time depending on the frame frequency.

The first driving period DP1 may include a non-emission period NEP (e.g., a first non-emission period) and an emission period EP (e.g., a first emission period).

The first driving period DP1 may include a period (e.g., a fifth period P5) in which a data signal that substantially corresponds to an output image is written.

The non-emission period NEP may include a first period P1 and a second period P2. The first period P1 may include a third period P3 and a fourth period P4. The second period P2 may include a fifth period P5 and a sixth period P6.

In an embodiment, the pulse width of the second scan signal to be supplied to the second scan line S2i may be the same as that of the first scan signal to be supplied to the first scan line S1i. In an embodiment, the second scan signal may be a signal obtained by shifting the first scan signal, for example. Hence, the second scan line S2i may share a scan signal with an i+k-th first scan line S1(i+k) of the i+k-th pixel row.

In an embodiment, the pulse widths of the first and second scan signals may be greater than the pulse width of the third scan signal and the pulse width of the fourth scan signal.

The first and second scan signals to be supplied to the n-type oxide semiconductor transistors may be at a high level. The third and fourth scan signals to be supplied to the p-type poly-silicon semiconductor transistors may be at a low level.

In an embodiment, in the non-emission period NEP, a waveform of the first emission control signal may differ from that of the second emission control signal. In an embodiment, the non-emission period NEP may be defined by the second emission control signal, for example. In other words, during the non-emission period NEP, the second emission control signal may be supplied (remain at the high level). The first period P1 and the second period P2 may be defined by the first emission control signal. In the first period P1, the first emission control signal may not be supplied. In the second period P2, the first emission control signal may be supplied.

When the supply of second emission control signal starts (i.e., the second emission control signal makes a transition to a high level), the non-emission period NEP may start. During the non-emission period NEP, the sixth transistor T6 may be turned off.

In the first period P1, the first emission control signal may not be supplied, and the fifth transistor T5 may have a turned-on state.

In the third period P3, the first scan signal may be supplied to the first scan line S1$i$, and the fourth transistor T4 may be turned on. The third power voltage Vint1 may be supplied to the first node N1. Hence, the voltage of the first node N1 (i.e., the voltages of the first gate electrode and the second gate electrode of the first transistor T1) may be initialized to the third power voltage Vint1. The third period P3 may be a period in which the voltage of the first node N1 is initialized, and be understood as being a gate initialization period.

Thereafter, during the fourth period P4, the supply of the first scan signal may be interrupted, and the second scan signal may be supplied to the second scan line S2$i$. The third transistor T3 may be turned on in response to the second scan signal. Therefore, the first transistor T1 may be connected in the form of a diode, and threshold voltage compensation of the first transistor T1 may be performed. The fourth period P4 may be understood as being a threshold voltage compensation period for the first transistor T1. Hence, a voltage corresponding to the threshold voltage of the first transistor T1 may be stored in the first capacitor Cst.

In an embodiment, during the first period P1, the operation of the third period P3 and the operation of the fourth period P4 may alternate with each other.

In an embodiment, the third power voltage Vint1 may be periodically supplied to the first node N1 by iteration of the third period P3, for example. Therefore, on-bias stress may be periodically applied to the first transistor T1, so that the bias state of the first transistor T1 may be periodically changed, whereby threshold voltage characteristics of the first transistor T1 may be changed (e.g., negatively shifted). Consequently, the characteristics of the first transistor T1 may be prevented from being fixed in a predetermined state and thus deteriorated.

Furthermore, a sufficient amount of total threshold voltage compensation time may be secured by iteration of the fourth period P4.

However, the foregoing is only an example, and the iteration of the third period P3 and the fourth period P4 is not limited thereto, and design thereof may be changed without limit.

Therefore, during the second period P2, the first emission control signal may be supplied to the first emission control line E1$i$, and the fifth transistor T5 may be turned off.

In the fifth period P5, the third scan signal may be supplied to the third scan line S3$i$, and the second transistor T2 may be turned on. Therefore, the voltage of the data signal may be supplied to the first gate electrode and the second gate electrode of the first transistor T1 through the second transistor T2 and the second capacitor Cpr. Here, the first gate electrode and the second gate electrode may be connected to each other by the connection line CNL. The fifth period P5 may be understood as being a data write period.

As such, the threshold voltage compensation period and the data write period may be separated from each other. Therefore, a sufficient amount of threshold voltage compensation time in high speed driving may be secured.

In the fifth period P5, gate signals may be supplied to the first gate electrode and the second gate electrode, and the first transistor T1 may be operated in a double gate mode. In other words, a channel may be defined in the semiconductor pattern of the first transistor T1 by the voltage applied to the first gate electrode and the voltage applied to the second gate electrode. The foregoing operation may be understood as being an operation of a double gate mode.

In the double gate mode, electric fields may be generated on both the first gate electrode and the second gate electrode, so that the electric field of the gate may be reinforced. Therefore, even when a change in voltage (e.g., a data signal) supplied to the first transistor T1 is small, variation of the driving current may be increased compared to that of the case where the first transistor T1 has a single gate.

Therefore, in the high speed driving, variation of the driving current may be increased (the driving current may more sensitively vary) in response to a rapid change in data voltage, and the light-emitting element LD may rapidly emit light at desired luminance. Consequently, the image quality in the high speed driving may be improved.

Subsequently, in the sixth period P6, the fourth scan signal may be supplied to the fourth scan line S4$i$, and the seventh transistor T7 may be turned on. The fourth power voltage Vint2 may be supplied to the third node N3 by turning on the seventh transistor T7, so that the parasitic capacitor of the light-emitting element LD may be discharged.

In an embodiment, the operation of the sixth period P6 may iterate during the seventh period P7. In an embodiment, the supply of the fourth scan signal may iterate during the seventh period P7, for example. Hence, black and low gray scale expression performance may be enhanced.

The sixth period P6 and the seventh period P7 may be periods in which the anode voltage of the light-emitting element LD is initialized, and may be understood as being anode initialization periods.

Thereafter, the supply of the first and second emission control signals may be interrupted so that the non-emission period NEP may end, and the emission period EP may start. During the emission period EP, the fifth and sixth transistors T5 and T6 may be turned on.

During the emission period EP, based on the data signal written in the fifth period P5, the driving current corresponding to the voltage stored in the first capacitor Cst may be supplied to the light-emitting element LD, so that the light-emitting element LD may emit light based on the driving current.

Figure 5:
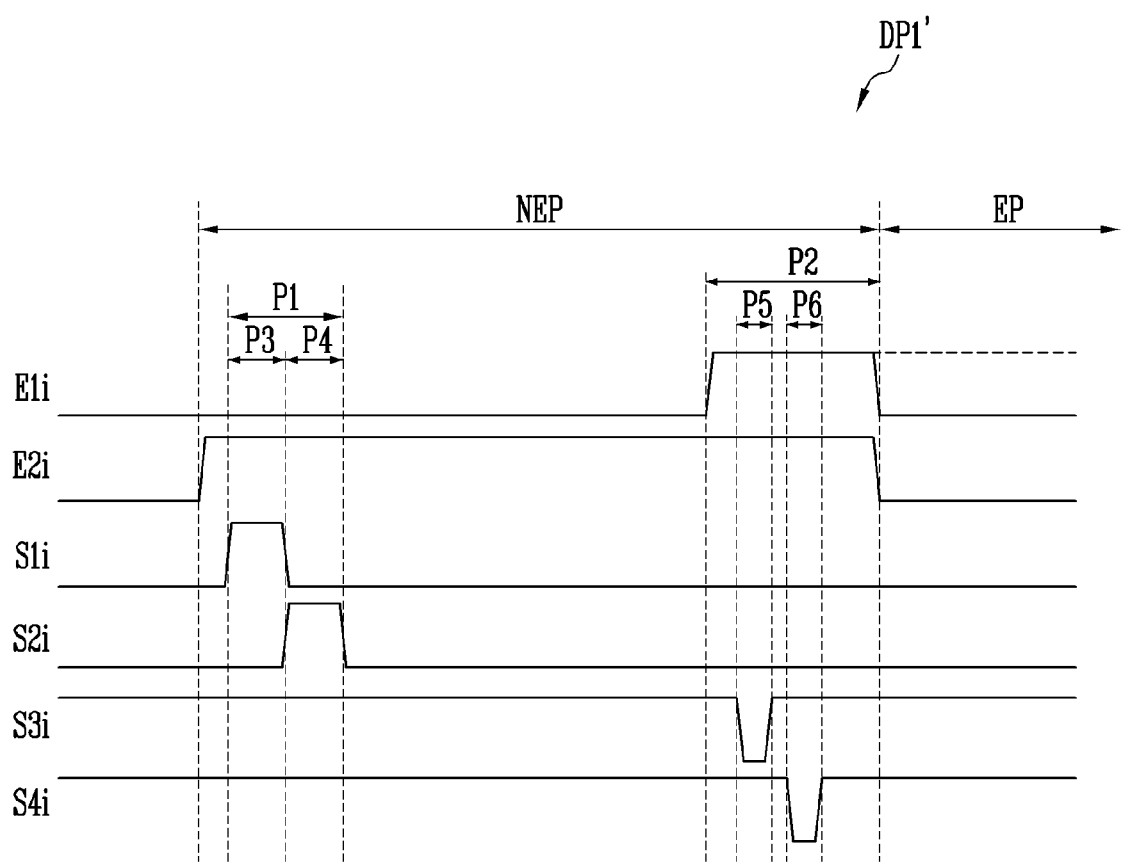
FIG. 5 is a timing diagram illustrating an embodiment of signals to be supplied to the pixel of FIG. 3 during a first driving period.

FIG. 5 is a timing diagram illustrating an embodiment of signals to be supplied to the pixel 10 of FIG. 3 during a first driving period.

The operation of the display device of FIG. 5, other than the number of times the first, second, and fourth scan signals are supplied, is substantially the same as the operation of the display device of FIG. 4. Therefore, like reference numerals will be used to designate components equal or similar to those of FIG. 4, and redundant explanation thereof will be omitted.

Referring to FIGS. 3 and 5, the pixel 10 may be operated during a first driving period DP1'.

In an embodiment, during a first period P1, the first scan signal may be provided one time in a third period P3, and the second scan signal may be provided one time in a fourth period P4. Furthermore, during a second period P2, the fourth scan signal may be provided one time in a sixth period P6.

Figure 6:
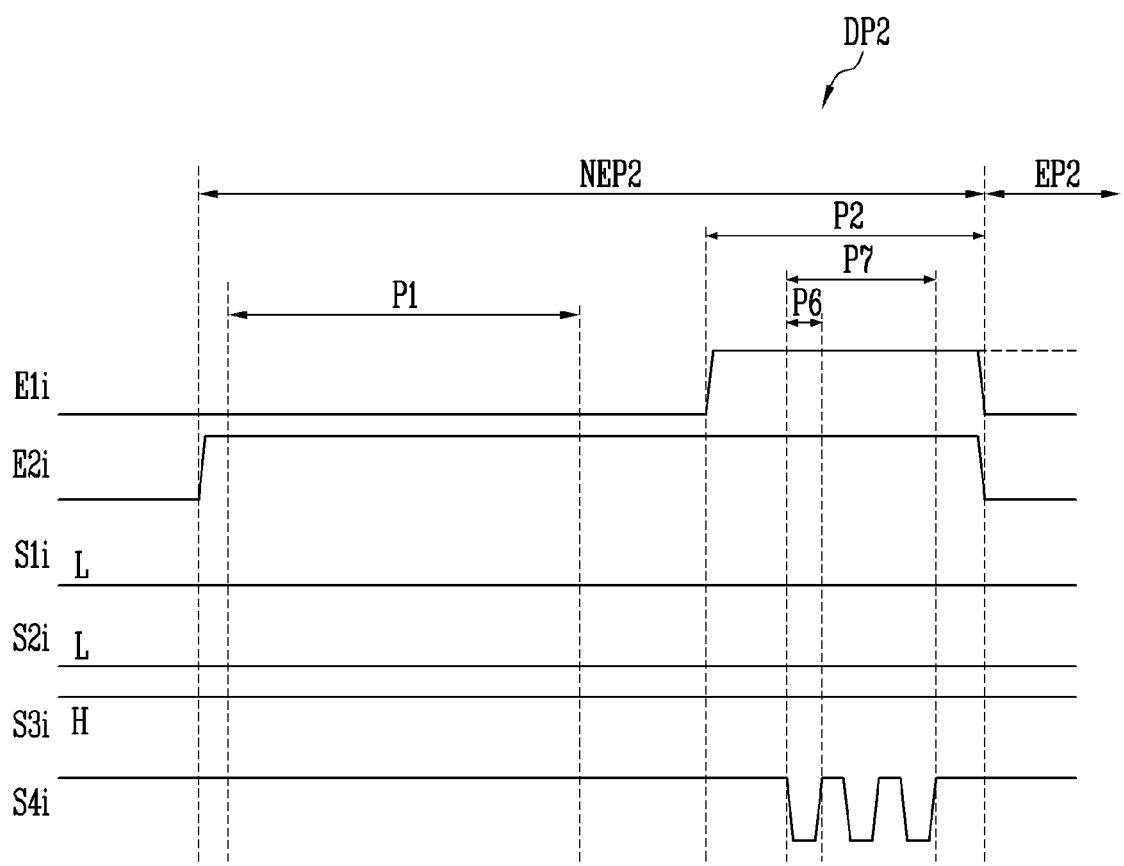
FIG. 6 is a timing diagram illustrating an embodiment of signals to be supplied to the pixel of FIG. 3 during a second driving period.

FIG. 6 is a timing diagram illustrating an embodiment of signals to be supplied to the pixel 10 of FIG. 3 during a second driving period.

Referring to FIGS. 3 and 6, the pixel 10 may be operated during a second driving period DP2.

The second driving period DP2 may include a second non-emission period NEP2 and a second emission period EP2. In the second driving period DP2, a data signal may not be supplied, and the fourth scan signal may be supplied to initialize the anode of the light-emitting element LD of the pixel 10.

In an embodiment, during the second non-emission period NEP2, the first and second emission control signals may be supplied in the same manner as that in the non-emission period NEP. However, the foregoing is only an example. During the second non-emission period NEP2, the first emission control signal may be supplied in the same waveform as that of the second emission control signal.

During the second driving period DP2, the supply of the first and second scan signals may be interrupted. In other words, the first scan signal that is supplied to the first scan line S11 and the second scan signal that is supplied to the second scan line S2i each may have a low level L.

During the second driving period DP2, the supply of the third scan signal may be interrupted. In other words, the third scan signal that is supplied to the third scan line S3i may have a high level H.

The fourth scan signal may be repetitively supplied to the fourth scan line S4i during a seventh period P7 including a sixth period P6. Therefore, low gray scale and block expression performance in the low frequency driving may be improved.

Figure 7A:
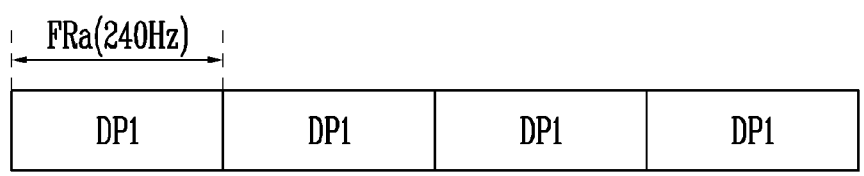
FIGS. 7A to 7C are diagrams each illustrating an embodiment of an operation of the display device of FIG. 1 according to a frame frequency.
Figure 7B:
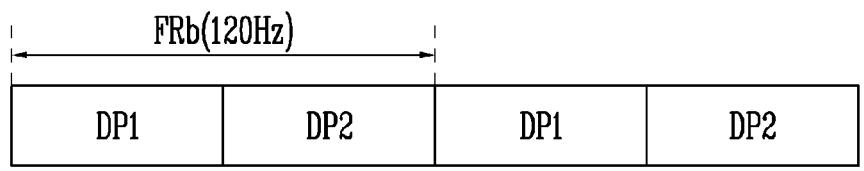
Figure 7C:
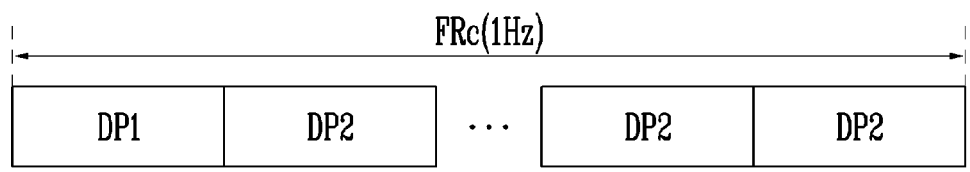

FIGS. 7A to 7C are diagrams each illustrating an embodiment of an operation of the display device 1000 of FIG. 1 according to a frame frequency.

Referring to FIGS. 1, and 3 to 7C, the display device 1000 may be driven at various frame frequencies.

The frequency of the first driving period DP1 may correspond to a frame frequency.

In an embodiment, as illustrated in FIG. 7A, the first frame FRa may include a first driving period DP1. In an embodiment, in a case that the frequency of the first driving period DP1 is about 240 Hz, the display device 1000 may be driven at about 240 Hz during the first frame FRa, for example. In other words, the first driving period DP1 and the first frame FRa may be about 4.17 milliseconds (ms) in time length.

In an embodiment, as illustrated in FIG. 7B, the second frame FRb may include a first driving period DP1 and a second driving period DP2. In an embodiment, the first driving period DP1 and the second driving period DP2 may be repeated, for example. In this case, the display device 1000 may be driven at about 120 Hz during the second frame FRb. In other word, the first driving period DP1 and the second driving period DP2 may be about 4.17 ms in time length. The second frame FRb may be about 8.33 ms in time length.

In an embodiment, as illustrated in FIG. 7C, the third frame FRc may include a first driving period DP1 and a plurality of repetitive second driving periods DP2. In an embodiment, in a case that the display device 1000 may be driven at about 1 Hz during the third frame FRc, the time length of the third frame FRc may be about 1 second, for example. In the third frame FRc, the second driving periods DP2 may be repeated about 239 times.

As such, the display device 1000 may be driven at various frame frequencies (e.g., about 1 Hz to about 480 Hz) without limit by controlling the iteration number of second driving period DP2 in each frame.

Figure 8:
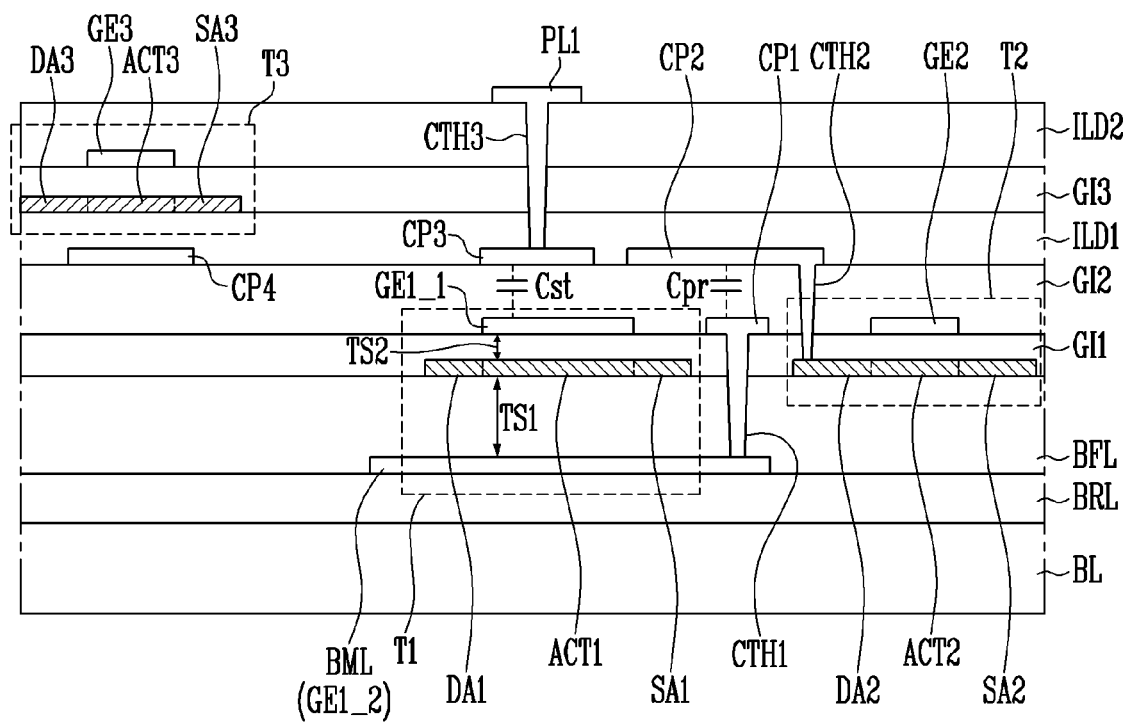
FIG. 8 is a cross-sectional view illustrating a portion of the pixel of FIG. 3.

FIG. 8 is a cross-sectional view illustrating a portion of the pixel 10 of FIG. 3.

Referring to FIGS. 3 and 8, the pixel 10 may include a backplane structure for forming the transistors T1 to T7 and the capacitors Cst and Cpr.

For convenience of description, FIG. 8 schematically illustrates the first transistor T1, the second transistor T2, the third transistor T3, the first capacitor Cst (the storage capacitor), and the second capacitor Cpr (the programmable capacitor).

The first transistor T1, the second transistor T2, the third transistor T3, and the first capacitor Cst, and the second capacitor Cpr may be formed or disposed on a base layer BL.

The first transistor T1 may include a first semiconductor pattern SCP1, a first gate electrode GE1_1 (e.g., a front gate electrode or a top gate electrode), and a second gate electrode GE1_2 (e.g., a back gate electrode or a bottom gate electrode). The second transistor T2 may include a second semiconductor pattern SCP2 and a third gate electrode GE2. The third transistor T3 may include a third semiconductor pattern SCP3 and a fourth gate electrode GE3.

The base layer BL may include insulating material such as glass or resin. Furthermore, the base layer BL may include material having flexibility so as to be bendable or foldable, and have a single layer or multilayer structure. In an embodiment, the base layer BL may include polyimide, for example.

A barrier layer BRL may be disposed on the base layer BL. The barrier layer BRL may prevent impurities from diffusing from the base layer BL into an upper structure. The barrier layer BRL may be an inorganic insulating layer including inorganic material. Polysiloxane, silicon nitride, silicon oxide, silicon oxynitride, or the like may be used as the inorganic material. In an alternative embodiment, the barrier layer BRL may be omitted.

A lower metal layer BML may be disposed on the barrier layer BRL. The lower metal layer BML may include metal. In an embodiment, the metal may include at least one of metals such as gold (Au), silver (Ag), aluminum (Al), molybdenum (Mo), chrome (Cr), titanium (Ti), nickel (Ni), neodymium (Nd), copper (Cu), or any alloys of the metals, for example. Furthermore, the lower metal layer BML may have a single layer structure, or a multilayer structure formed or provided by stacking layers including two or more materials of metals and alloys.

The lower metal layer BML may include the second gate electrode GE1_2 of the first transistor T1.

A buffer layer BFL may be disposed on the lower metal layer BML. The buffer layer BFL may prevent impurities from diffusing into each circuit element. In an embodiment, the buffer layer BFL may include at least one of silicon nitride, silicon oxide, and silicon oxynitride.

The first semiconductor pattern SCP1 and the second semiconductor pattern SCP2 may be disposed on the buffer layer BFL. In an embodiment, the first semiconductor pattern SCP1 and the second semiconductor pattern SCP2 each may include a poly-silicon semiconductor. In an embodiment, the first semiconductor pattern SCP1 and the second semiconductor pattern SCP2 may be formed or provided, for example, through a low-temperature poly-silicon ("LTPS") process.

The first semiconductor pattern SCP1 may include a first active area ACT1, a first source area SA1, and a first drain area DA1. The first active area ACT1 may be an undoped channel area and overlap the first gate electrode GE1_1 and the second gate electrode GE1_2. The first source area SA1 and the first drain area DA1 each may include a semiconductor layer doped with a dopant. The second semiconductor pattern SCP2 may include a second active area ACT2, a second source area SA2, and a second drain area DA2. The second source area SA2 and the second drain area DA2 each may include a semiconductor layer doped with a dopant. The foregoing, however, is only one of embodiments. In another embodiment, the source area and the drain area may be switched with each other.

A first gate insulating layer GI1 that covers the first semiconductor pattern SCP1 and the second semiconductor pattern SCP2 may be disposed on the buffer layer BFL. The first gate insulating layer GI1 may be an inorganic insulating layer including the foregoing inorganic material.

The first gate electrode GE1_1, the third gate electrode GE2, and the first conductive pattern CP1 may be disposed on the first gate insulating layer GI1. The first gate electrode GE1_1, the third gate electrode GE2, and the first conductive pattern CP1 may include the same material as one another. In an embodiment, the first gate electrode GE1_1, the third gate electrode GE2, and the first conductive pattern CP1 each may include at least one of metals such as gold (Au), silver (Ag), aluminum (Al), molybdenum (Mo), chrome (Cr), titanium (Ti), nickel (Ni), neodymium (Nd), copper (Cu), and any alloys of the metals. Furthermore, a first conductive layer in which the first gate electrode GE1_1, the third gate electrode GE2, and the first conductive pattern CP1 are disposed may have a single layer structure, or a multilayer structure formed or provided by stacking layers including two or more materials of metals and alloys.

The first gate electrode GE1_1 may overlap the first active area ACT1. In an embodiment, a thickness of the buffer layer BFL along a thickness direction (e.g., vertical direction in FIG. 8) may be greater than that of the first gate insulating layer GI1. Therefore, a distance TS2 between the first gate electrode GE1_1 and the first semiconductor pattern SCP1 may be less than a distance TS1 between the second gate electrode GE1_2 and the first semiconductor pattern SCP1. Hence, in the first transistor T1 having a dual gate structure, the first gate electrode GE1_1 may be mainly operated, and the second gate electrode GE1_2 may perform an auxiliary function.

Furthermore, when a data signal is supplied to the pixel 10, the same voltage may be provided to the first and second gate electrodes GE1_1 and GE1_2, and electric fields may be generated on both the first gate electrode and the second gate electrode. Consequently, the electric field of the gate of the first transistor T1 may be reinforced, and an operation of controlling the current (driving current) of the first transistor T1 may be facilitated.

The third gate electrode GE2 may overlap the second active area ACT2.

The first conductive pattern CP1 may be connected to the second gate electrode GE1_2 through a first contact hole CTH1 that passes through the first gate insulating layer GI1 and the buffer layer BFL. The first conductive pattern CP1 may be connected with the first gate electrode GE1_1 in an area not shown in FIG. 8 while avoiding the first source and drain areas SA1 and DA1. Therefore, as shown in FIG. 8, the first gate electrode GE1_1 and the second gate electrode GE1_2 may be connected to each other.

A second gate insulating layer GI2 that covers the first gate electrode GE1_1, the third gate electrode GE2, and the first conductive pattern CP1 may be disposed on the first gate insulating layer GI1. In an embodiment, the second gate insulating layer GI2 may include at least one of polysiloxane, silicon nitride, silicon oxide, and silicon oxynitride.

The second conductive pattern CP2, the third conductive pattern CP3, and the fourth conductive pattern CP4 may be disposed on the second gate insulating layer GI2. In an embodiment, the second, third, and fourth conductive patterns CP2, CP3, and CP4 may include at least one of metals such as gold (Au), silver (Ag), aluminum (Al), molybdenum (Mo), chrome (Cr), titanium (Ti), nickel (Ni), neodymium (Nd), copper (Cu), or any alloys of the metals. Furthermore, a second conductive layer in which the second conductive pattern CP2, the third conductive pattern CP3, and the fourth conductive pattern CP4 are disposed may have a single layer structure, or a multilayer structure formed or provided by stacking layers including two or more materials of metals and alloys.

The second conductive pattern CP2 may be connected to the second drain area DA2 through a second contact hole CTH2 that passes through the second gate insulating layer GI2 and the first gate insulating layer GI1. Furthermore, the second conductive pattern CP2 may overlap the first conductive pattern CP1. Consequently, the first conductive pattern CP1 and the second conductive pattern CP2 may constitute the second capacitor Cpr.

The third conductive pattern CP3 may overlap the first gate electrode GE1_1. The third conductive pattern CP3 and the first gate electrode GE1_1 may constitute the first capacitor Cst. In other words, the third conductive pattern CP3 may be an upper electrode of the first capacitor Cst. The first gate electrode GE1_1 may be a lower electrode of the first capacitor Cst.

The fourth conductive pattern CP4 may provide a third scan signal to the fourth gate electrode GE3 of the third transistor T3.

A first inter-insulating layer ILD1 that covers the second, third, and fourth conductive patterns CP2, CP3, and CP4 may be disposed on the second gate insulating layer GI2. The first inter-insulating layer ILD1 may be an inorganic insulating layer including inorganic material. Polysiloxane, silicon nitride, silicon oxide, silicon oxynitride, or the like may be used as the inorganic material.

The third semiconductor pattern SCP3 may be disposed on the first inter-insulating layer ILD1. The third semiconductor pattern SCP3 may include an oxide semiconductor or a metal oxide semiconductor. The third semiconductor pattern SCP3 may include a third active area ACT3, a third source area SA3, and a third drain area DA3.

A third gate insulating layer GI3 that covers the third semiconductor pattern SCP3 may be disposed on the first inter-insulating layer ILD1. In an embodiment, the third gate insulating layer GI3 may include at least one of polysiloxane, silicon nitride, silicon oxide, and silicon oxynitride.

The fourth gate electrode GE3 may be disposed on the third gate insulating layer GI3. In an embodiment, the fourth gate electrode GE3 may include at least one of metals such as gold (Au), silver (Ag), aluminum (Al), molybdenum (Mo), chrome (Cr), titanium (Ti), nickel (Ni), neodymium (Nd), copper (Cu), and any alloys of the metals. Furthermore, a third conductive layer in which fourth gate electrode GE3 is disposed may have a single layer structure, or a multilayer structure formed or provided by stacking layers including two or more materials of metals and alloys.

The second inter-insulating layer ILD2 may cover the fourth gate electrode GE3 and be disposed on the third gate insulating layer GI3. In an embodiment, the second inter-insulating layer ILD2 may include at least one of polysiloxane, silicon nitride, silicon oxide, and silicon oxynitride.

The first power line PL1 may be disposed on the second inter-insulating layer ILD2. In an embodiment, the first power line PL1 may include at least one of metals such as gold (Au), silver (Ag), aluminum (Al), molybdenum (Mo), chrome (Cr), titanium (Ti), nickel (Ni), neodymium (Nd), copper (Cu), and any alloys of the metals. Furthermore, a fourth conductive layer in which the first power line PL1 is disposed may have a single layer structure, or a multilayer structure formed or provided by stacking layers including two or more materials of metals and alloys. The first power line PL1 may be connected to the third conductive pattern CP3 through a third contact hole CTH3.

As such, the second capacitor Cpr may be obtained using the first conductive pattern CP1 disposed on the first gate insulating layer GI1 and the second conductive pattern CP2 disposed on the second gate insulating layer GI2.

Figure 9:
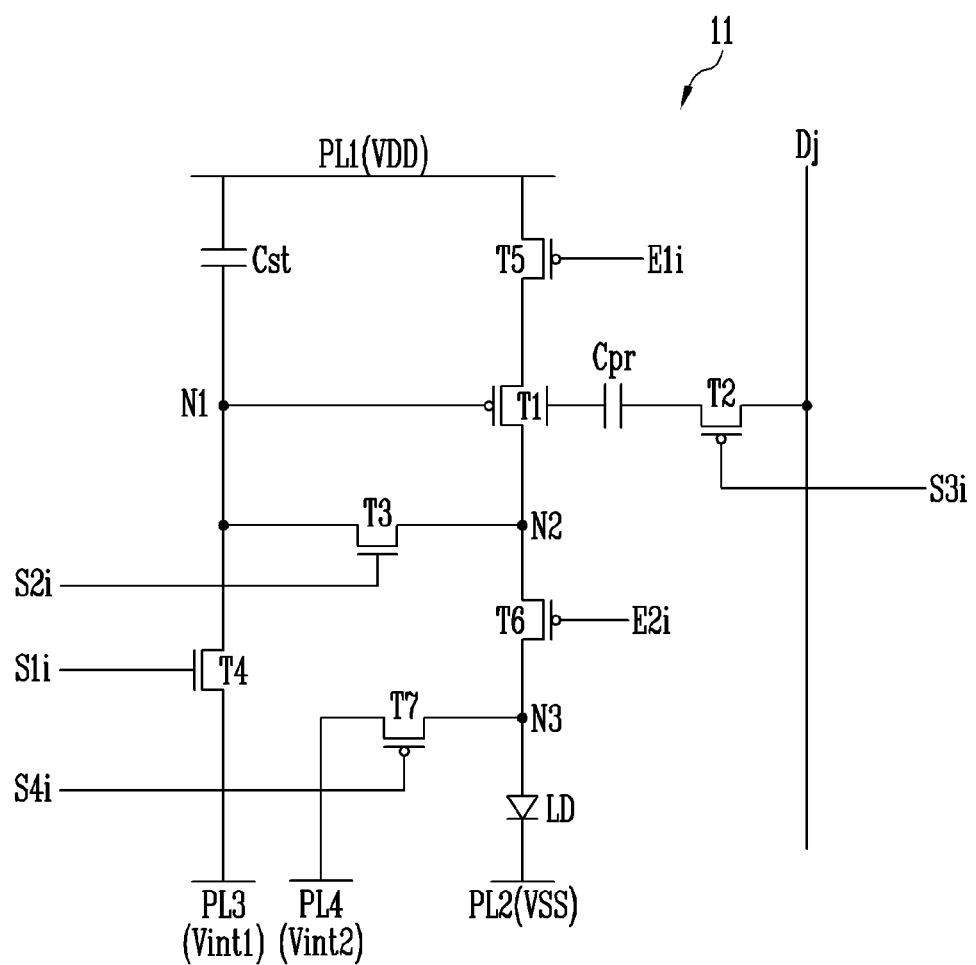
FIG. 9 is a circuit diagram illustrating a pixel in accordance with the invention.
Figure 10:
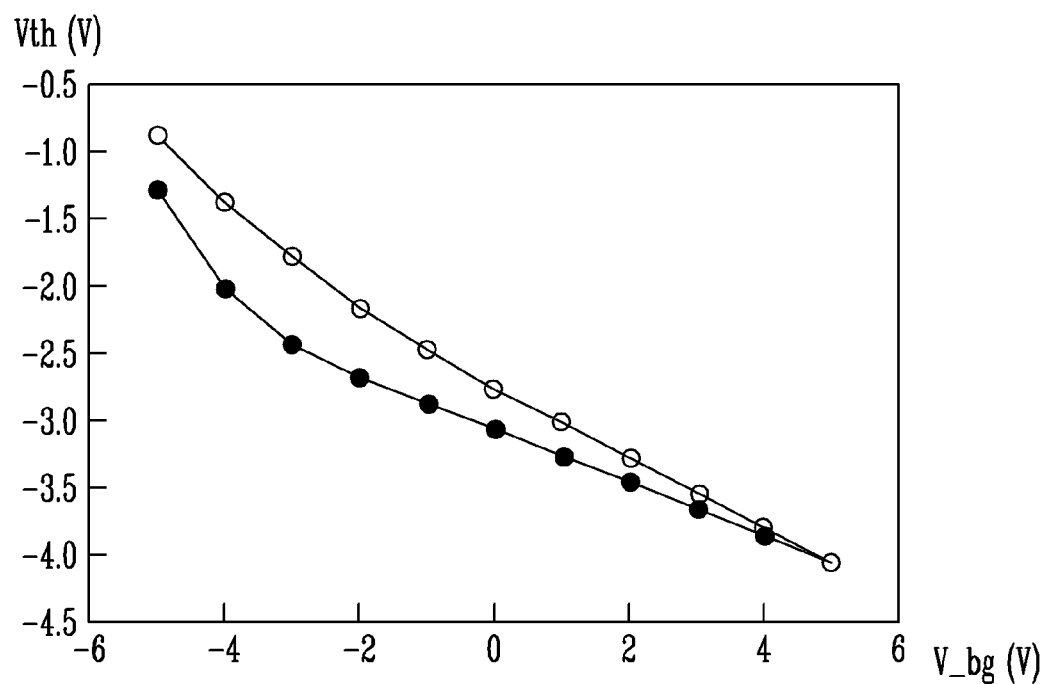
FIG. 10 is a graph illustrating an embodiment of a relationship between a threshold voltage and a voltage to be applied to a second gate electrode of a first transistor of the pixel of FIG. 9.

FIG. 9 is a circuit diagram illustrating a pixel 11 in accordance with the invention. FIG. 10 is a graph illustrating an embodiment of a relationship between a threshold voltage and a voltage to be applied to a second gate electrode of a first transistor of the pixel of FIG. 9.

The pixel 11 of FIG. 9 may be substantially equal or similar to that of the pixel 10 of FIG. 3 other than a connection relationship between the first gate electrode and the second gate electrode of the first transistor T1. Therefore, like reference numerals will be used to designate like or similar components, and redundant explanation thereof will be omitted.

Referring to FIGS. 9 and 10, the pixel 11 may include a light-emitting element LD, first to seventh transistors T1 to T7, a first capacitor Cst (also referred to as "storage capacitor"), and a second capacitor Cpr (also referred to as "programmable capacitor").

The first transistor T1 may include a first gate electrode and a second gate electrode. In an embodiment, the first gate electrode and the second gate electrode may be electrically insulated from each other. In this case, as illustrated in FIG. 10, a change in characteristics of a threshold voltage Vth of the first transistor T1 may be caused. In an embodiment, the threshold voltage of the first transistor T1 may be shifted depending on variation of a second gate voltage V_bg that is a voltage of the second gate electrode. In other words, the characteristics of the first transistor T1 may be changed, depending on the second gate voltage V_bg, by a distance between the channel area (the active area) of the first transistor and the first gate electrode and/or a distance between the channel area (the active area) of the first transistor and the second gate electrode, and a voltage relationship based on thickness of the channel. In an embodiment, as the voltage of a data signal to be supplied to the second gate electrode (i.e., the lower metal layer BML included in the first transistor T1 in FIG. 8) is increased, the threshold voltage of the first transistor T1 may be reduced, for example.

The second capacitor Cpr may provide a voltage based on a data signal to the second gate electrode. The pixel 11 may provide a written voltage only to the second gate electrode through the second capacitor Cpr and change the characteristics of the first transistor T1, so that the threshold voltage Vth of the first transistor T1 may vary. In other words, the pixel 11 may control the driving current by the variation of the threshold voltage Vth, and adjust the luminance of the light-emitting element LD. Here, no data signal is provided to the first gate electrode (e.g., the first node N1).

Hence, the pixel 11 may have a simple backplane structure compared to that of the pixel 10 of FIG. 3 and respond to both a high frequency and a low frequency.

Figure 11:
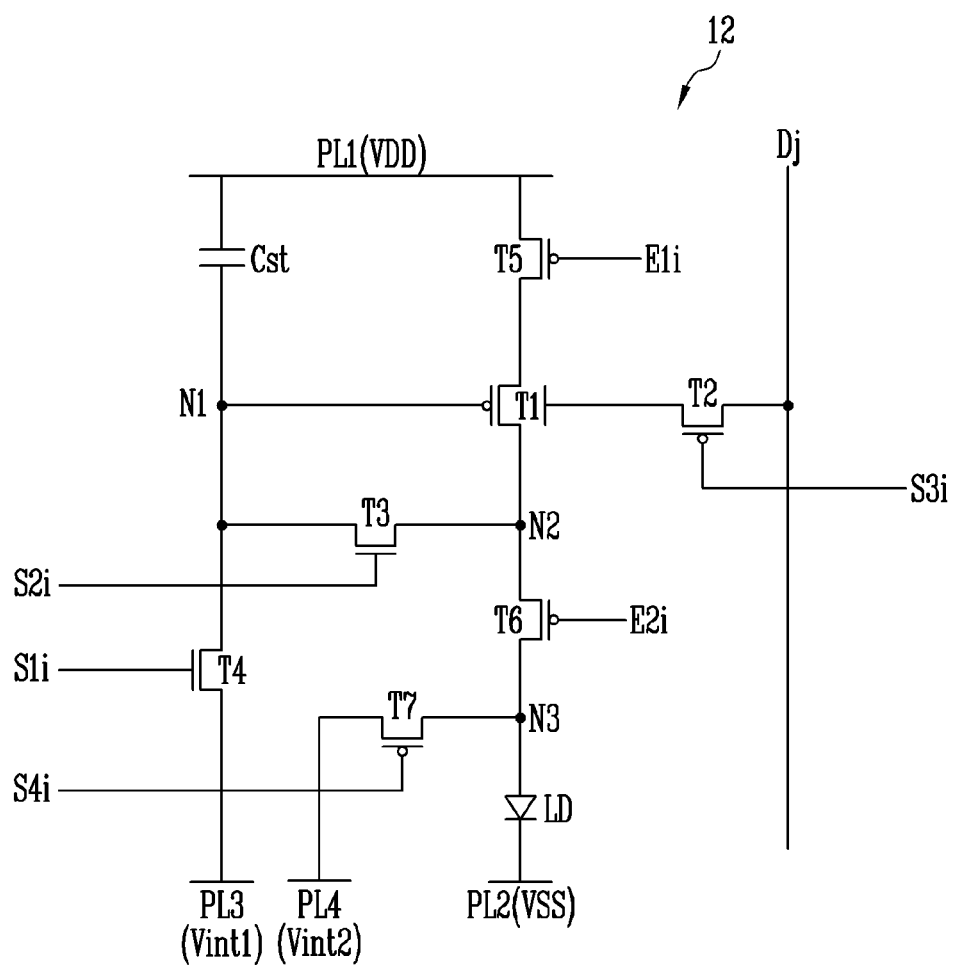
FIG. 11 is a circuit diagram illustrating a pixel in accordance with the invention.

FIG. 11 is a circuit diagram illustrating a pixel 12 in accordance with the invention.

The pixel 12 of FIG. 11 may be substantially equal or similar to the pixel 11 of FIG. 9 other than the second capacitor Cpr. Therefore, like reference numerals will be used to designate like or similar components, and redundant explanation thereof will be omitted.

Referring to FIG. 11, the pixel 12 may include a light-emitting element LD, first to seventh transistors T1 to T7, a first capacitor Cst (or a storage capacitor).

In an embodiment, the second transistor T2 may be connected between a second gate electrode of the first transistor T1 and the data line Dj. The data signal may be provided to the second gate electrode of the first transistor T1 through the second transistor T2.

In an embodiment, the second capacitor Cpr illustrated in FIG. 9 may be omitted in the pixel 12, for example. Therefore, there is no need to secure space for forming the second capacitor Cpr, so that the design of a pixel circuit may be facilitated compared to that of the pixel 11 of FIG. 9.

As described above, a pixel including an oxide semiconductor transistor and a poly-silicon semiconductor transistor and a display device including the pixel in embodiments of the invention may include a first transistor including a first gate electrode (a top gate) and a second gate electrode (a bottom gate), and have an improved pixel circuit structure in which a data signal is provided to at least one of the first and second gate electrodes. Furthermore, a threshold voltage compensation period and a data write (programming) period may be separately driven. Therefore, images may be appropriately displayed not only at a general driving frequency but also at a low frequency of about 10 Hz or less or a high frequency of about 120 Hz or more. Furthermore, the driving current may be rapidly and precisely controlled in response to frequent variation in driving frequency and a data signal change.

While embodiments of the invention have been described above, those skilled in the art will appreciate that various modifications, additions and substitutions are possible, without departing from the scope and spirit of the invention claimed in the appended claims.

What is claimed is:

1. A pixel comprising:
   a light-emitting element;
   a first transistor which generates a driving current which flows from a first power line which provides a first power voltage to a second power line which provides a second power voltage through the light-emitting element, the first transistor comprising a first gate electrode and a second gate electrode;

a second transistor which is connected between a data line and the second gate electrode of the first transistor, and turned on in response to a third scan signal supplied to a third scan line;
a third transistor which is connected between a first node connected to the first gate electrode of the first transistor and a second node, and turned on in response to a second scan signal supplied to a second scan line;
a fourth transistor which is connected between the first node and a third power line, provides a third power voltage, and turned on in response to a first scan signal supplied to a first scan line;
a fifth transistor which is connected between the first power line and the first transistor, and turned off in response to a first emission control signal supplied to a first emission control line;
a sixth transistor which is connected between a third node connected to an electrode of the light-emitting element and the second node, and turned off in response to a second emission control signal supplied to a second emission control line; and
a first capacitor connected between the first power line and the first node.

2. The pixel according to claim 1, further comprising:
a second capacitor connected between the second gate electrode of the first transistor and the second transistor.

3. The pixel according to claim 2, further comprising:
a connection line which connects the first gate electrode and the second gate electrode.

4. The pixel according to claim 1, wherein the third transistor and the fourth transistor each comprise an n-type oxide semiconductor transistor, and
wherein the first transistor, the second transistor, the fifth transistor, and the sixth transistor each comprise a p-type poly-silicon semiconductor transistor.

5. The pixel according to claim 4, wherein the sixth transistor is in a turned off state during a non-emission period,
wherein the sixth transistor is in a turned on state during an emission period, and
wherein the non-emission period includes a first period during which the fifth transistor is in a turned on state, and a second period during which the fifth transistor is in a turned off state.

6. The pixel according to claim 5, wherein the third transistor and the fourth transistor are respectively turned on at time points different from each other in the first period, and
wherein the second transistor is turned on in the second period.

7. The pixel according to claim 6, further comprising:
a seventh transistor which is connected between the third node and a fourth power line for providing a fourth power voltage, and turned on in response to a fourth scan signal supplied to a fourth scan line.

8. The pixel according to claim 7, wherein, in the second period, the fourth transistor is turned on after the second transistor is turned off.

9. The pixel according to claim 6, wherein the first gate electrode and the second gate electrode are electrically insulated from each other.

10. The pixel according to claim 3, wherein the first transistor further comprises:
a lower metal layer disposed on a substrate, and including the second gate electrode; and
a first semiconductor pattern disposed on a buffer layer which covers the lower metal layer, and including a first active area,
wherein the first gate electrode is disposed on a first gate insulating layer which covers the first semiconductor pattern, and overlaps the first active area.

11. The pixel according to claim 10, wherein a thickness of the buffer layer is greater than a thickness of the first gate insulating layer.

12. The pixel according to claim 10, wherein the second transistor comprises:
a second semiconductor pattern disposed on a buffer layer, and including a second active area; and
a gate electrode disposed on the first gate insulating layer, and overlapping the second active area.

13. The pixel according to claim 12, wherein the second capacitor comprises:
a first conductive pattern connected to the second gate electrode through a first contact hole, and disposed on the first gate insulating layer; and
a second conductive pattern connected to the second semiconductor pattern through a second contact hole, and disposed on a second gate insulating layer which covers the first gate electrode, the second conductive pattern overlapping the first conductive pattern.

14. The pixel according to claim 13, wherein the first capacitor comprises:
a lower electrode corresponding to the first gate electrode; and
an upper electrode disposed on the second gate insulating layer, and overlapping the lower electrode, and
wherein the third transistor comprises:
a third semiconductor pattern disposed on an inter-insulating layer which covers the upper electrode, and including a third active area; and
a gate electrode overlapping the third active area.

15. A display device comprising:
a pixel connected to first to third scan lines, first and second emission control lines, and a data line, the pixel comprising:
a light-emitting element;
a first transistor which generates a driving current which flows from a first power line which provides a first power voltage to a second power line which provides a second power voltage through the light-emitting element, the first transistor including a first gate electrode and a second gate electrode;
a second transistor which is connected between the data line and the second gate electrode of the first transistor, and turned on in response to a third scan signal supplied to the third scan line;
a third transistor which is connected between a first node connected to the first gate electrode of the first transistor and a second node, and turned on in response to a second scan signal supplied to the second scan line;
a fourth transistor which is connected between the first node and a third power line which provides a third power voltage, and turned on in response to a first scan signal supplied to the first scan line;
a fifth transistor which is connected between the first power line and the first transistor, and turned off in response to a first emission control signal supplied to the first emission control line; and
a sixth transistor which is connected between a third node connected to an electrode of the light-emitting element and the second node, and turned off in response to a second emission control signal supplied to the second emission control line;

a scan driver which supplies the first to third scan signals to the first to third scan lines, respectively;

an emission driver which supplies the first and second emission control signals to the first and second emission control lines, respectively; and a data driver which supplies a data signal to the data line.

16. The display device according to claim 15, wherein the pixel further comprises:

a capacitor connected between the second gate electrode of the first transistor and the second transistor; and a connection line which connects the first gate electrode and the second gate electrode.

17. The display device according to claim 16, wherein the third transistor and the fourth transistor each comprise an n-type oxide semiconductor transistor, and wherein the first transistor, the second transistor, the fifth transistor, and the sixth transistor each comprise a p-type poly-silicon semiconductor transistor.

18. The display device according to claim 17, wherein the emission driver supplies the second emission control signal during a non-emission period, and wherein the non-emission period includes a first period in which the first emission control signal is not supplied, and a second period in which the first emission control signal is supplied.

19. The display device according to claim 18, wherein the scan driver alternately supplies the first scan signal and the second scan signal in the first period, and wherein the scan driver supplies the third scan signal in the second period.

20. The display device according to claim 19, the display device further comprising a fourth scan line which is connected to the pixel and supplies a fourth scan signal from the scan driver, wherein the pixel further comprises:

a seventh transistor which is connected between the third node and a fourth power line which provides a fourth power voltage, and turned on in response to the fourth scan signal supplied to the fourth scan line, and wherein the scan driver, in the second period, supplies the third scan signal and thereafter supplies the fourth scan signal.

* * * * *